US006781361B2

(12) United States Patent
Nestler

(10) Patent No.: US 6,781,361 B2
(45) Date of Patent: Aug. 24, 2004

(54) APPARATUS AND SYSTEM FOR ELECTRICAL POWER METERING USING DIGITAL INTEGRATION

(75) Inventor: Eric Nestler, Harvard, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/132,912

(22) Filed: Apr. 26, 2002

(65) Prior Publication Data

US 2002/0175671 A1 Nov. 28, 2002

Related U.S. Application Data

(60) Provisional application No. 60/286,639, filed on Apr. 26, 2001.

(51) Int. Cl.$^7$ ................................. G01R 7/00
(52) U.S. Cl. ..................................... 324/142
(58) Field of Search ................. 324/142, 141, 324/140 R, 103 R; 702/60, 61

(56) References Cited

U.S. PATENT DOCUMENTS

| | | | |
|---|---|---|---|
| 5,298,857 A | | 3/1994 | Voisine et al. |
| 5,311,117 A | | 5/1994 | Komatsu et al. |
| 5,736,848 A | * | 4/1998 | De Vries et al. ............ 324/142 |
| 5,760,617 A | | 6/1998 | Coln et al. |
| 5,862,069 A | | 1/1999 | Nestler |
| 5,924,051 A | | 7/1999 | Provost et al. |
| 6,008,635 A | | 12/1999 | Haefele et al. |
| 6,058,354 A | | 5/2000 | Adame et al. |
| 6,078,870 A | * | 6/2000 | Windsheimer ............... 702/61 |

FOREIGN PATENT DOCUMENTS

DE  196 13 732 A1  10/1997

OTHER PUBLICATIONS

"Phase Correction of Linear Time Invariant Systems With Digital All–Pass Filters"; by Rik Pintelon, IEEE Transactions on Instrumentation And Measurement, vol. 39, No. 2, Apr., 1990, pp.: 324–330.
"A New Current Measuring Principle for Power Electronic Applications"; Karrer et al.; Proceedings of ISPSD, 1999, pp. 270–282, Swiss Federal Institute of Technology; Zurich Switzerland, month unavailable.
"Rogowski Coils"; David Ward Bocoil Limited; 1965 North Yorkshire, U.K., month unavailable.
Real–Time Integration and Differentiation of Analog Signals By Means of Digital Filtering: Pintelon et al.; Vrije Universiteit Brussel, Brussels, Belgium; 1990 IEEE; pp. 346–352, month unavailable.
"Active Energy Metering IC with di/dt Sensor Interface" ADE7759; Analog Devices, Norwood, Massachusetts; 2001; pp. 1–32, month unavailable.

* cited by examiner

Primary Examiner—Vinh P. Nguyen
(74) Attorney, Agent, or Firm—Gauthier & Connors LLP

(57) ABSTRACT

A power metering system including a first modulator receiving a first analog voltage associated with a current and outputting a first digitized signal. A second modulator receives a second analog voltage and outputs a second digitized signal. A first lowpass filter filters out high frequency noise associated with the first signal and decimates the frequency of the first digitized signal. The first lowpass filter outputs a first filtered signal. An interpolator performs up sampling of the signal associated with the first filtered signal. The interpolator outputs a first up sampled signal. An integrator integrates the first up sampled signal. The integrator outputs an integrated signal. A first multiplier multiplies the second digitized signal and integrated signal, and outputs a multiplied signal. The multiplied signal being used to measure power.

18 Claims, 4 Drawing Sheets

APPARATUS AND SYSTEM FOR ELECTRICAL POWER METERING USING DIGITAL INTEGRATION

PRIORITY INFORMATION

This application claims priority from provisional application Ser. No. 60/286,639 filed Apr. 26, 2001.

BACKGROUND OF THE INVENTION

The invention relates to the digital integration of the output of a sigma-delta modulator used in electrical energy metering applications.

There is provided in the art a circuit that includes a sensor that generates a first signal that is proportional to the derivative of a current with respect to time in an electrical power line having a nominal frequency of 60 Hz. This sensor has a non-ideal phase characteristic that includes a phase deviation from 90° at the nominal line frequency. An underdamped integrator integrates the first signal, compensating for the phase deviation in the non-ideal phase characteristic of the current sensor. The integrator has a transfer function with a magnitude peak at a frequency below the line frequency and with a phase shift deviating from 90° at the line frequency. This sensor interfaces directly to a flux sensor, thus making it an inefficient design. The system refers to an off-chip opamp circuit which does the integration. These extra analog components are subject to much variation, such as opamp DC off-set, allowing inaccuracies and manufacturing variations to be introduced.

Another technique is using a flux sensor for current measurement. The integration is done digitally and an additional digital filter is added to compensate for analog domain filters that condition the analog output of the flux sensor. However, these filters introduce various errors that must be compensated.

SUMMARY OF THE INVENTION

According to one aspect of the invention, there is provided a power metering measurement device. The power metering measurement device includes a first modulator that receives a first analog voltage associated with a current and outputs a first digitized signal. A second modulator receives a second voltage and outputs a second digitized signal. A first lowpass filter receives the first digitized signal and filters out high frequency noise associated with the first signal and decimates the frequency of the first digitized signal. The first lowpass filter outputs a first filtered signal. An interpolator receives a signal associated with the first filtered signal and performs up sampling of the signal associated with the first filtered signal, the interpolator outputting a first up sampled signal. An integrator receives the first up sampled signal and integrates the up sampled signal. The integrator outputs an integrated signal, and also compensates for phase errors introduced to the first up sampled signal and the integrator. A first multiplier multiplies the second digitized signal and integrated signal, and outputs a multiplied signal. The multiplied signal is used to measure power.

In yet another aspect of the invention, there is provided a filter system used in a power metering system. The filter system includes a first lowpass filter filters out high frequency noise associated with the first signal and decimates the frequency of the first digitized signal. The first lowpass filter outputs a first filtered signal. An interpolator receives a signal associated with the first filtered signal and performs up sampling of the signal associated with the first filtered signal. The interpolator outputs a first up sampled signal. An integrator receives the first up sampled signal and integrates the up sampled signal. The integrator outputs an integrated signal, and also compensates for phase errors introduced to the first up sampled signal and integrator.

In yet another aspect of the invention, there is provided an integrator used in metering systems. The integrator includes a core filter that receives a digitized signal and performs integration on the digitized signal. The core filter outputs an integrated signal. A compensator receives the integrated signal and filters phase errors introduced to the integrated signal, thus outputting a reliable integrated digitized signal.

DETAILED DESCRIPTION OF THE INVENTION

Figure 1:
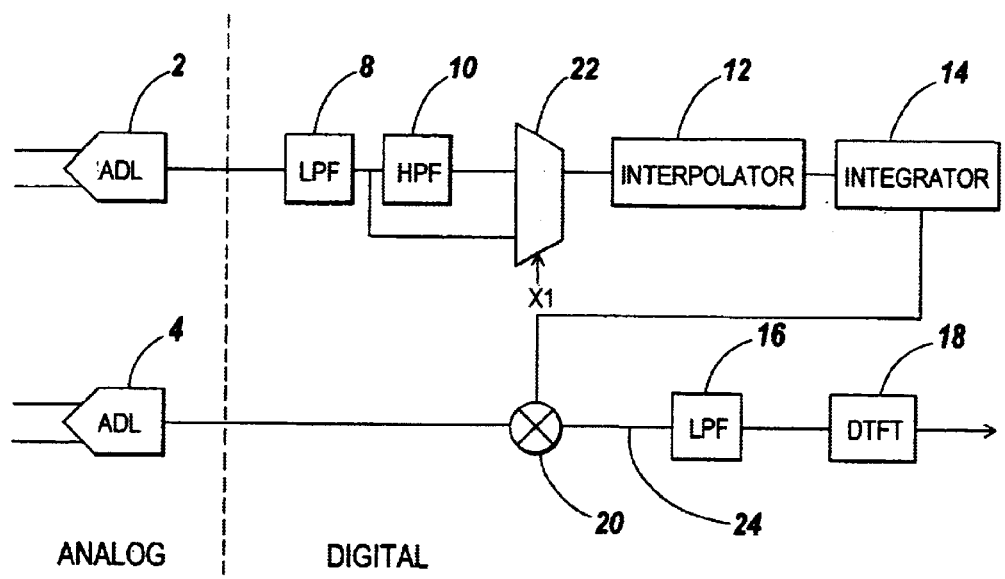
FIG. 1 is a schematic block diagram of a signal processor of an active energy metering IC.

FIG. 1 is a schematic block diagram of a signal processor 1 of an active energy metering IC. The signal processor 1 includes a first 2 and second 4 analog to digital converters (ADC), a first low pass filter 8, and high pass filter 10, a multiplexer 22, an interpolator 12, a integrator 14, a second multiplier 20, a second low pass filter 16, and a digital to frequency (DTF) converter 18. The signal processor 1 measures the DC power value associated with a metering location. The first ADC 2 and second ADC 4 extract the measured voltage and currents from the metering location. In this embodiment, the second ADC 4 extracts the voltage and the first ADC 2 extracts the current measured from the metering location. The first ADC 2 does not measure the actual current but a voltage value that is associated with the current using a flux measurement current to voltage sensor. This sensor generates a voltage that is the first derivative of the current being sensed. The ADC 2 is connected to the flux measurement current to voltage sensor.

In this embodiment, each of the first ADC 2 and second ADC 4 can be an oversampling sigma-delta modulator that provides a one-bit output data stream at a predetermined data rate. The one-bit output data stream of each of the first ADC 2 and second ADC 4 is a serial stream of bits having a logical value of "1" or "−1". The data rate of each of the serial stream of bits is equal to the sample rate of the ADC from which the data stream is generated. The ratio of the number of bits of the data stream having a value of "1" to the number of bits having a value "−1" over a given time period at the output of each of the first ADC 2 and second ADC 4 provides a magnitude of the analog signals received at the inputs of the first ADC 2 and second ADC 4. As indicated in FIG. 1, each of the first ADC 2 and second ADC 4 provide an analog-to-digital conversion of the signal received at the metering location.

The first low pass filter 8 provides low-pass digital filtering and decimation of the one-bit output data stream of the first ADC 2. The first low pass filter 8 filters out high frequency noise produced by the first ADC 2. Also, the first low pass filter 8 filters out high frequency noise produced by the first ADC 2. In particular, the first low pass filter 8 filters out shape noise. The first low pass filter 8 acts like a decimator and converts the one-bit output data stream, to a n-bit data stream where n is an integer greater than 1. In this embodiment, n is equal to 16.

The output of the first low pass filter 8 is provided to the high pass filter 10. The high pass filter 10 receives and proceeds to filter out high frequency noise. This is done to remove low frequency and DC noise, because the first low pass filter 8 only filters out high frequency and not the low frequency and DC noise. Thus, a cleaner signal for processing is provided. However, the high-pass filter 10 can be optional in this embodiment.

The multiplexer 22 provides either the output signal from the low pass filter 8 or the output from the high pass filter 10. The multiplexer 22 receives as input a signal x1 that determines which of the two signals are outputted to the interpolator 12. The input signal x1 has two binary values, 1 and 0. The value of "1" provides the output of the first low pass filter 8 as input to the interpolator 12. The value of "0" provides the output from the high pass filter 10 as input to the interpolator 12. The user can pre-select which input will be provided to the interpolator 12 based on how effective high pass filter 10 is in filtering out certain noise from the signal. For example, whether the noise is at the corner frequency of the high pass filter 10. As mentioned above, the high pass filter 10 is an optional component of this embodiment.

The interpolator 12 receives the n-bit data stream from the multiplexer 22. The interpolator 12 performs an up sampling of the n-bit data stream by a certain factor I1. In this embodiment, I1 is 32. The factor I1 may be equal to the decimation factor D1 of the first low pass filter 8. The sample rate of the first ADC 2 is equal to the sample rate of the second ADC 4, which is equal to 1 megahertz. Also the n-bit output signal from the interpolator 12 can be at the same data rate as the one-bit signal output from the second ADC 4.

However, the sample rate of first ADC 2 may not be equal to the sample rate of the second ADC 4. The ratio of the decimation factor D1 of the first low pass filter 8 to the sample factor I1 of the interpolator 12 can be selected such that the n-bit output data stream of the interpolator 12 and the one bit output data stream of the second ADC 4 are at the same rate. In this embodiment, the ability to sample the input signals from the first ADC 2 and the second ADC 4 at different sample rates provides additional flexibility in multiplying dissimilar signals. Also, the interpolator 12 may be an optional component if the sample rate of the second ADC 4 is selected properly. In this case, the decimation D1 is then 1.

The integrator 14 receives as input the output from the interpolator 12. As mentioned above, the first ADC 2 receives its input from a flux measurement current to voltage sensor. This type of sensor generates a voltage that is the derivative of the current being sensed. The integrator 14 performs a first order integration on the output of the current side waveform to cancel the effect of the first derivative and to generate a digital signal that is proportional to the current being sensed. The integrator 14 is implemented as a sequence of digital filters. One digital filter provides the basic integrator function and one or more filters are used to compensate for gain or phase error in the frequency band of interest that are associated with elements in the signal path following first ADC 2. The order of the interpolator 12 and the integrator 14 could be reversed without affecting the invention.

The second multiplier 20 has a first input coupled to the output of the integrator 14, a second input coupled to the output of the second ADC 4, and an output 24 coupled to the second low pass filter 16. In this embodiment, the voltage at the second ADC 4 is proportional to a sine wave and the voltage measured at the first ADC 2 is proportional to the derivative of the current, thus making the voltage at the first ADC 2 proportional to a cosine wave. The integrator 14 integrates the voltage at the first ADC 2 to a sine wave. The two inputs to the second multiplier 20 are sine waves, and the frequency spectrum of each of the signals consists of a single impulse at the sine wave frequency. When the inputs to the second multiplier 20 are multiplied, the output 24 is a sine wave signal twice the input frequency plus a DC term. The DC term is used to determine average power.

The second low pass filter 16, similar to the first low pass filter 8 receives the output signal from the multiplier 20 and provides low pass filtering. The second low pass filter 16 removes quantization noise from the output signal generated in the second ADC 4. The output of the second low pass filter 16 is an n-bit multiplied result of the two outputs of the first ADC 2 and second ADC 4. The invention can also include non-sine wave inputs at the first ADC 2 and second ADC 4.

The digital-to-frequency (DTF) module 18 receives as input the output of the low pass filter 16. The DTF module 18 determines the DC power associated with the output of the signal from the first low pass filter 8.

Figure 2:
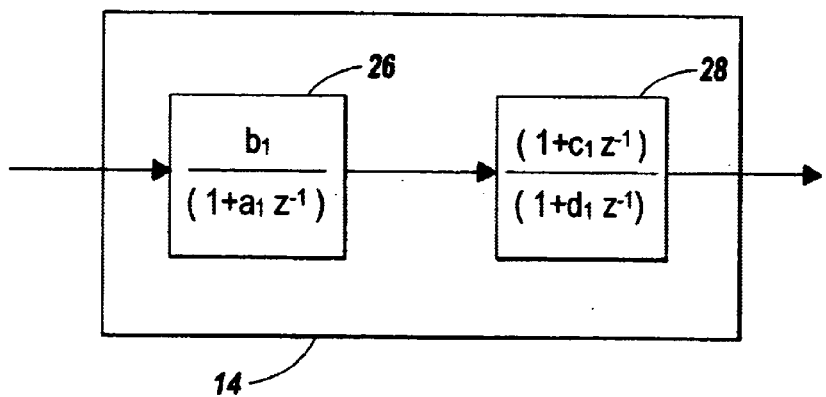
FIG. 2 is a schematic block diagram of the integrator.

FIG. 2 is a schematic block diagram of the integrator 14 of FIG. 1. The integrator 14 includes a core filter 26 and a compensation filter 28. The core filter 26 is single pole IIR low pass filter. The core filter 26 receives as input the output of the interpolator 12. The core filter 26 functions as a digital integrator because the passband of interest is above the corner frequency of the core filter 26. The gain and phase characteristics of an ideal single pole low pass filter is similar to the gain and phase characteristics of an ideal integrator when the passband of interest is greater than the lowpass filter corner frequency. The core filter 26 is generally defined as $$\frac{b_1}{(1 + a_1 z^{-1})} \qquad \text{Eq. 1}$$

where a1 and b1 are constant values. The core filter 26 is implemented as a digital integrator that provides some gain and phase error when compared to an ideal integrator. These errors are defined by the difference equation $$y[n] = \text{pole} * x[n] + (1 - \text{pole}) * y[n-1] \qquad \text{Eq. 2}$$

where pole is the pole value associated with Eq. 1, x[n] is the actual input value to the core filter 26, and y[n] is the error output value. The pole value can be defined with This equation is an approximation of the difference equation derived from the bilinear transform method of converting the S-domain H(s) polynomial to an H(z) polynomial. The difference equation after the bilinear transform is:

$$y[n] = 0.5 * \text{pole} * x[n] + 0.5 * \text{pole} * x[n-1] + (1 - \text{pole}) * y[n-1] \qquad \text{Eq. 3}$$

Another approximation difference equation is based on the expectation that the input signals are low frequency, and changes from $x[n-1]$ to $x[n]$ are small. This approximation equation is defined as $$y[n]=\text{pole}*x[n-1]+(1-\text{pole})*y[n-1]. \quad \text{Eq. 4}$$

These three difference equations have three different characteristics of gain and phase errors at high frequencies. All three have similar gain and phase errors at low frequencies. In this embodiment, the phase error is in a passband between 45 Hz and 2 kHz and the phase error must be less than about 0.02 degrees. The gain error must be less than approximately 0.05 dB. Because of this disparity in the system requirements, the compensation technique is concentrating on the phase error compensation. There is a phase error at low frequencies and high frequencies. This is realized because using the approximation equation Eq. 4 causes a high frequency phase error, though it does simplify the hardware a bit. By using the approximation equation Eq. 3 makes this high frequency phase error zero.

Both the high frequency and low frequency phase errors can be compensated by the use of a compensator filter 28 with a transfer function $H(z)$ defined as $$H(z) = \frac{(1+c_1 z^{-1})}{(1+d_1 z^{-1})} \quad \text{Eq. 5}$$

where $c_1$ and $d_1$ are constants values that are selected by a user to be discussed more below. Note if $c_1 = d_1$ the compensator filter 28 becomes an allpass filter. For the compensator filter 26 to be an effective filter the constant values of $c_1$ and $d_1$ are defined as $$c_1 = -(1-\text{pole}2 - (\Delta\text{pole}*\text{pole}2)) \quad \text{Eq. 6}$$

$$d_1 = -(1-\text{pole}2 + (\Delta\text{pole}*\text{pole}2)) \quad \text{Eq. 7}$$

where pole2 is the pole value associated with the denominator of Eq. 5, and the $\Delta$pole is a small fraction of the pole2 defined in the range of 0.05, which causes a zero in the numerator to be slightly separated from the pole2 in the denominator. The pole2 can be given in radians. The $\Delta$pole is empirically defined to get the best phase compensation at some frequency or range of frequencies, and is a unitless fractional value. The pole and $\Delta$pole value are defined to be $$0 > \text{pole}2 << 1 \text{ and } 0 > \Delta\text{pole} < 1 \quad \text{Eq. 8}$$

where both pole2 and $\Delta$pole are $<<1$.

The affect of this relationship is to shift the zero of equation 5 slightly higher or lower in frequency and pole slightly lower or higher in frequency. The values of pole and $\Delta$pole can be adjusted to increase or decrease the peak negative phase and move the frequency that the negative peak occurs up or down.

The compensator filter 28 can be comprised of one or more filters to reduce the phase errors over a passband that includes high and low frequencies. However, each of these filters should exhibit similar properties as that described in Eq 5.

Figure 3A:
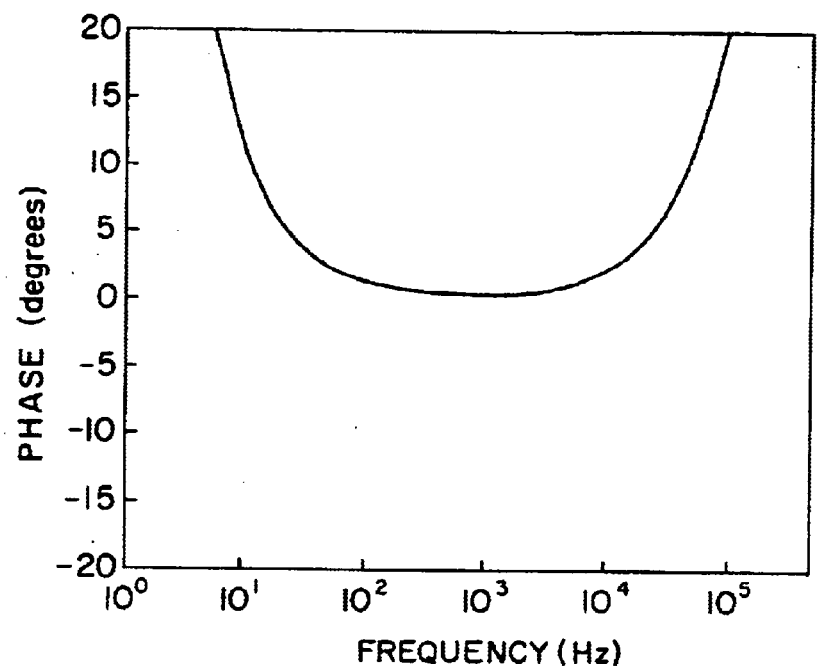
FIGS. 3A and 3B are graphs of the gain and phase error of the core filter.
Figure 3B:
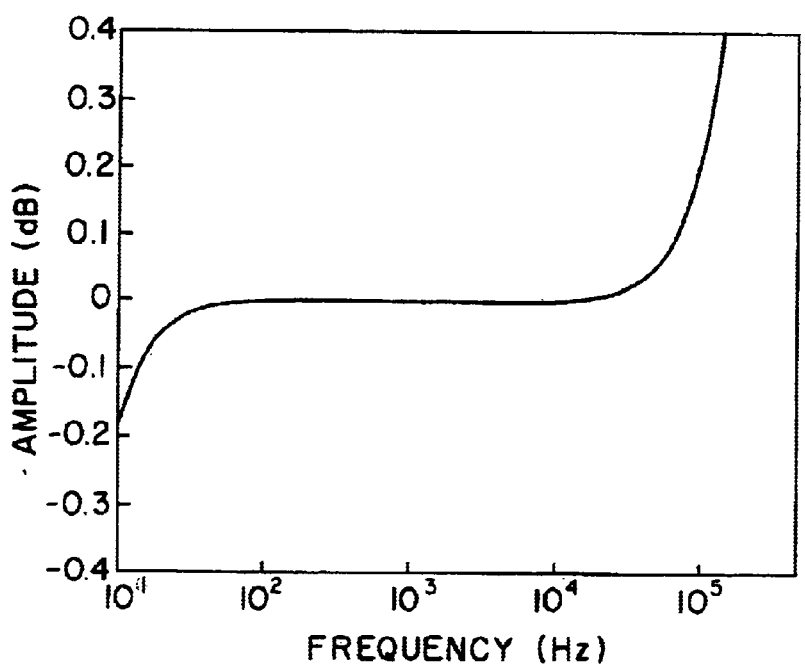

FIGS. 3A and 3B are graphs of the gain and phase error of the core filter 26. As discussed above, the invention requires that phase error and gain error of the integrator 14 should be within a defined range over a target range of frequencies. The phase error must be less than about 0.02 degrees. The gain error must be less than about 0.05 dB. The nominal line frequency, for example 60 Hz, is a point of interest because that is the frequency for which metering devices are measured from.

FIG. 3A demonstrates that the phase error is approximately 4 degrees at 60 Hz, which does not satisfy the above mentioned phase error requirement. Note that at approximately 120 Hz the phase error is about 0.02 degrees and rises steadily afterwards. This is why the compensator filter 28 is used to compensate for the phase error. The graphical results of compensator 26 will be discussed more below.

FIG. 3B also demonstrates that the gain error is approximately 0.01 at 60 Hz. The gain error is within its previously defined range. The gain error is not a major issue because its value in a passband between 45 Hz and 2 kHz is about 0.01.

Figure 4A:
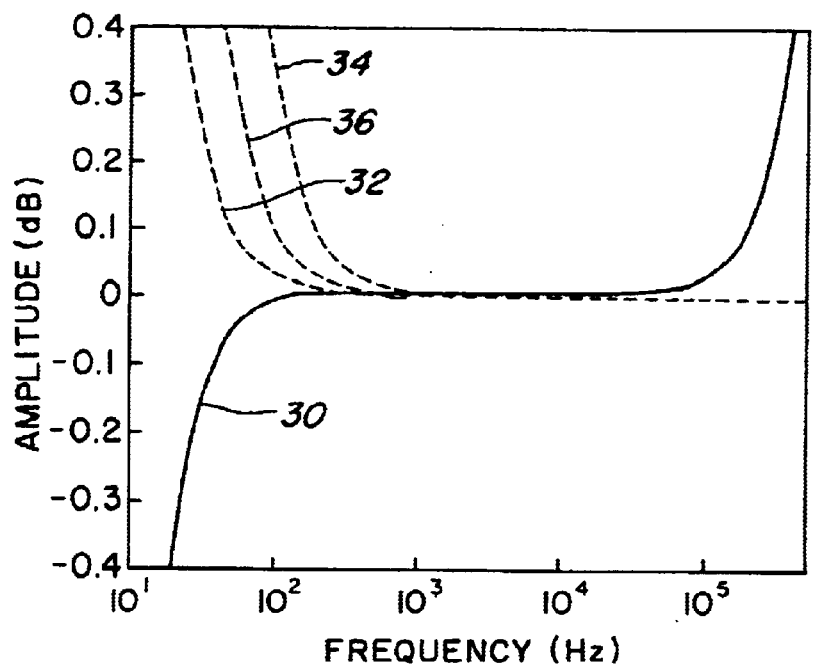
FIGS. 4A and 4B are graphs of gain and phase plots for the compensation filter 26 with three different pole values.
Figure 4B:
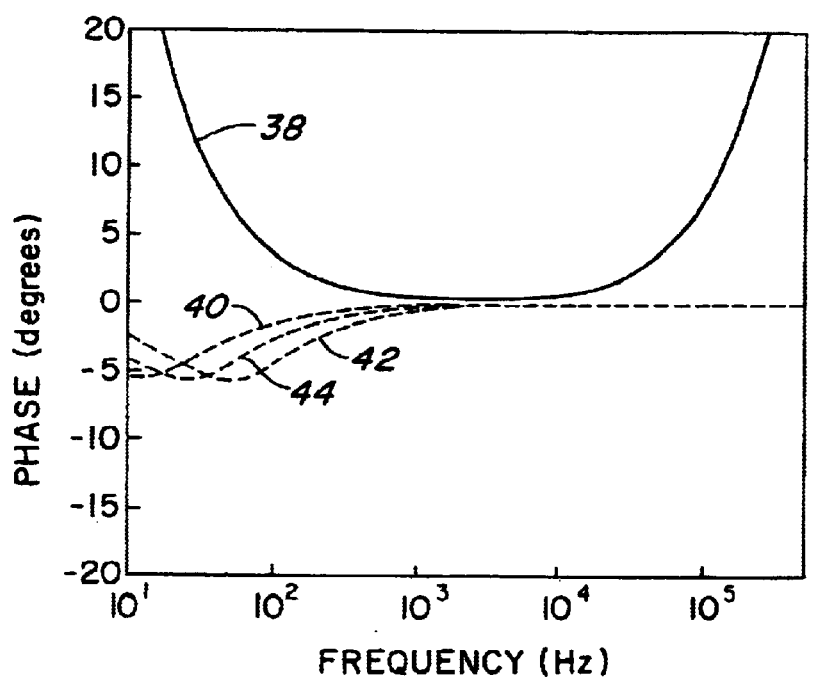

FIGS. 4A and 4B are graphs of gain and phase plots for the compensation filter 28 with three different pole values. The graph 30 of FIG. 4A is associated with the gain error of the core filter 26, as shown in FIG. 3B. The graphs 32, 34, and 36 are graphical representations of the gain error associated with the compensator filter 28, and each is also associated with a different pole value. The pole values of each of the graphs 32, 34, and 36 are $10^{-13}, 10^{-14},$ and $10^{-15},$ respectively. The frequency minimums associated with the graphs 32, 34, and 36 move horizontally, thus, by changing pole values, the frequency minimums also change along the frequency axis.

In FIG. 4B, the graph 38 is the phase error graph of the core filter 26, as shown in FIG. 3A. The graphs 40, 42, and 44 are associated with the phase error of the compensation filter 28, and each has a different pole value. The same pole values used in FIG. 4A are also being used here. Therefore, the pole values of each of the graphs 40, 42, and 44 are $10^{-13}, 10^{-14},$ and $10^{-15},$ respectively.

As similarly discussed above, the frequency minimums associated with graphs 40, 42, and 44 move along the frequency axis. That shows that by changing the pole values of the compensation filter 28, the frequency minimum moves horizontally along the frequency axis.

Figure 5A:
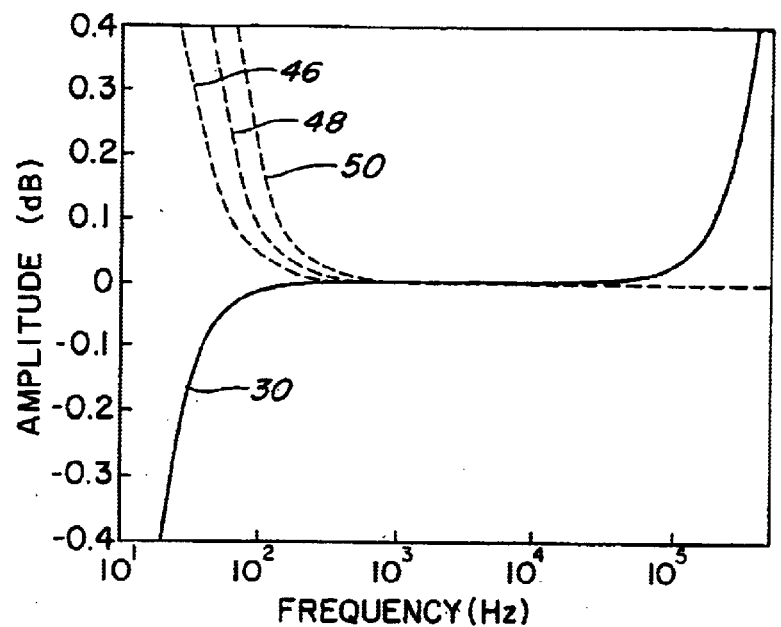
FIGS. 5A and 5B are graphs of gain and phase plots for the compensation filter with three different pole values.
Figure 5B:
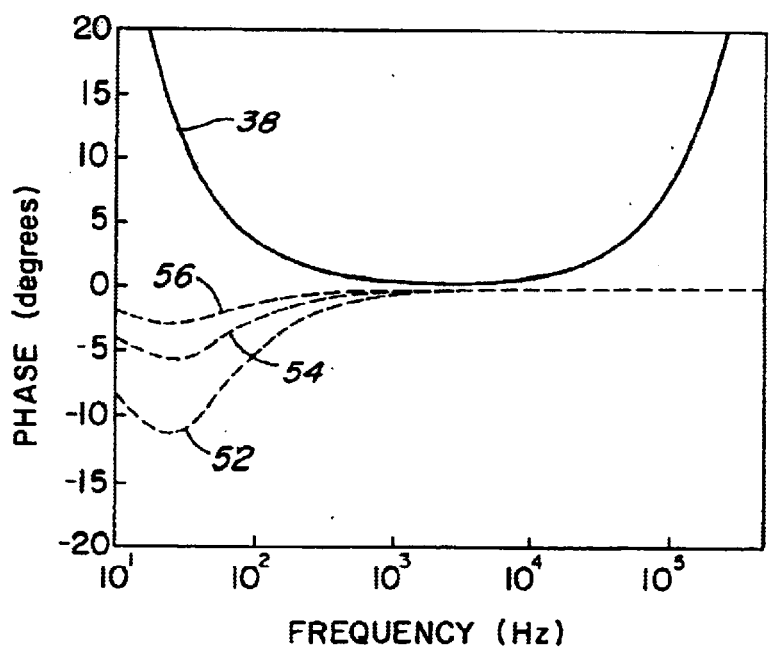

FIGS. 5A and 5B are graphs of gain and phase plots for the compensation filter 28 with three different pole values. The graph 30 of FIG. 5A is the gain error graph of the core filter 26, as shown in FIG. 3B. The graphs 46, 48, and 50 are graphs associated with the gain error of the compensation filter 28, and each has a different $\Delta$pole value. The $\Delta$pole values of each of the graphs 46, 48, and 50 are 0.05, 0.1, and 0.2, respectively. The frequency minimums associated with the graphs 46, 48, and 50 move along the amplitude axis. The location on the along the frequency axis does not change for each $\Delta$pole value, just the amplitude axis. This shows that by changing $\Delta$pole values of the compensator filter 28 the gain error also moves vertically.

In FIG. 5B, the graph 38 is associated with the phase error of the core filter 26, as shown in FIG. 3A. The graphs 52, 54, and 56 are phase error graphs of the compensation filter 28, and each are associated with a different $\Delta$pole value. The same $\Delta$pole values used in FIG. 5A are also being used here. Therefore, the $\Delta$pole values of each of the graphs 40, 42, and 44 are 0.05, 0.1, and 0.2, respectively.

As similarly discussed above, the frequency minimums associated with graphs 52, 54, and 56 move vertically along the phase axis. That shows that by changing the $\Delta$pole values of the compensation filter 28, the frequency minimum associated with phase error moves vertically along the phase axis.

Although the present invention has been shown and described with respect to several preferred embodiments thereof, various changes, omissions and additions to the form and detail thereof, may be made therein, without departing from the spirit and scope of the invention.

What is claimed is:

1. A power metering measurement system comprising:
   a first modulator receiving a first analog voltage associated with a current and outputting a first digitized signal;
   a second modulator receiving a second analog voltage and outputting a second digitized signal;
   a first lowpass filter filtering out high frequency noise associated with said first digitized signal and decimating the frequency of said first digitized signal, said first lowpass filter outputting a first filtered signal;
   an interpolator receiving a signal associated with said first filtered signal and performing up sampling of said signal associated with said first filtered signal, said interpolator outputting a first up sampled signal;
   an integrator integrating said up sampled signal and outputting an integrated signal, said integrator also compensating for phase errors introduced to said first up sampled signal and said integrator; and
   a first multiplier multiplying said second digitized signal and integrated signal and outputting a multiplied signal, said multiplied signal being used to measure power.

2. The system of claim 1 further comprising a highpass filter filtering low frequency noise associated with said first filtered signal, said highpass filter outputting a second filtered signal.

3. The system of claim 2, wherein said signal associated with said first filtered signal is said second filtered signal.

4. The system of claim 1 further comprising a second low pass filter filtering out high frequency noise associated with said multiplied signal, said second low pass filter outputting a third filtered signal.

5. The system of claim 4 further comprising a digital to frequency converter receiving said third filtered signal and providing a signal indicative of said measured power.

6. The system of claim 1, wherein said integrator includes a core filter providing integration of said signal associated with said first signal and a compensator filter for compensating phase error associated said core filter.

7. The system of claim 6, wherein said integrator produces a gain error of less than about 0.05.

8. The system of claim 6, wherein said integrator produces a phase error of less than about 4 degrees.

9. The system of claim 1, wherein said first modulator receives its input from a flux measurement sensor device.

10. The system of claim 9, wherein said first voltage is shifted 90 degrees from said current.

11. A filter system comprising:
    a first lowpass filter filtering out high frequency noise associated with a first digitized signal received from a modulator and decimating the frequency of said first digitized signal, said first lowpass filter outputting a first filtered signal;
    an interpolator receiving a signal associated with said first filtered signal and performing up sampling of said signal associated with said first filtered signal, said interpolator outputting a first up sampled signal; and
    an integrator integrating said up sampled signal, said integrator outputting an integrated signal and compensating for phase errors introduced to said first up sampled signal and said integrator.

12. The filter system of claim 11 further comprising a highpass filter filtering low frequency noise associated with said first filtered signal, said highpass filter outputting a second filtered signal.

13. The filter system of claim 12, wherein said signal associated with said first filtered signal is said second filtered signal.

14. The filter system of claim 11, wherein said integrator includes a core filter providing integration of said signal associated with said first signal and a compensator filter for compensating phase error associated said core filter.

15. The filter system of claim 14, wherein said integrator producing a gain error of less than about 0.05.

16. The filter system of claim 14, wherein said integrator producing a phase error of less than about 4 degrees.

17. The filter system of claim 11, wherein said first modulator receives its input from a flux measurement sensor device.

18. The filter system of claim 17, wherein said first voltage is shifted 90 degrees from said current.

* * * * *